(12) United States Patent
Gardner et al.

(10) Patent No.: US 7,960,993 B2
(45) Date of Patent: Jun. 14, 2011

(54) METHOD FOR CAPACITIVE TESTING OF FLAT PANEL DISPLAYS

(75) Inventors: David W. Gardner, Colorado Springs, CO (US); Andrew M. Hawryluk, Los Altos, CA (US)

(73) Assignee: Photon Dynamics, Inc., San Jose, CA (US)

( * ) Notice: Subject to any disclaimer, the term of this patent is extended or adjusted under 35 U.S.C. 154(b) by 0 days.

(21) Appl. No.: 12/547,251

(22) Filed: Aug. 25, 2009

(65) Prior Publication Data

US 2010/0045334 A1 Feb. 25, 2010

Related U.S. Application Data

(60) Continuation of application No. 12/047,275, filed on Mar. 12, 2008, now abandoned, which is a division of application No. 11/379,413, filed on Apr. 20, 2006, now Pat. No. 7,466,161.

(60) Provisional application No. 60/697,844, filed on Jul. 8, 2005, provisional application No. 60/689,601, filed on Jun. 9, 2005, provisional application No. 60/687,621, filed on Jun. 2, 2005, provisional application No. 60/673,967, filed on Apr. 22, 2005.

(51) Int. Cl.
*G01R 31/26* (2006.01)
(52) U.S. Cl. .......... 324/760.01; 324/754.21; 324/754.28
(58) Field of Classification Search .................. None
See application file for complete search history.

(56) References Cited

U.S. PATENT DOCUMENTS

| | | | |
|---|---|---|---|
| 5,036,317 A | 7/1991 | Buzak | |
| 5,057,775 A | 10/1991 | Hall | |
| 5,258,705 A | 11/1993 | Okamoto et al. | |
| 5,561,381 A | 10/1996 | Jenkins et al. | |
| 5,694,053 A | 12/1997 | Smith | |
| 6,600,325 B2 | 7/2003 | Coates et al. | |
| 6,859,062 B2 | 2/2005 | Fujii et al. | |
| 6,995,566 B2 | 2/2006 | Yamaoka et al. | |
| 7,466,161 B2 | 12/2008 | Gardner et al. | |
| 2004/0100299 A1 | 5/2004 | Murakawa et al. | |

(Continued)

FOREIGN PATENT DOCUMENTS

JP 5126890 A 5/1993

OTHER PUBLICATIONS

Non-Final Office Action for U.S. Appl. No. 12/540,256, mailed on Mar. 24, 2010, 10 pages.

(Continued)

*Primary Examiner* — Vinh P Nguyen
(74) *Attorney, Agent, or Firm* — Kilpatrick Townsend & Stockton LLP; Ardeshir Tabibi

(57) ABSTRACT

Each sensor of a linear array of sensors includes, in part, a sensing electrode and an associated feedback circuit. The sensing electrodes are adapted to be brought in proximity to a flat panel having formed thereon a multitude of pixel electrodes in order to capacitively measure the voltage of the pixel electrodes. Each feedback circuit is adapted to actively drive its associated electrode via a feedback signal so as to maintain the voltage of its associated electrode at a substantially fixed bias. Each feedback circuit may include an amplifier having a first input terminal coupled to the sensing electrode and a second input terminal coupled to receive a biasing voltage. The output signal of the amplification circuit is used to generate the feedback signal that actively drives the sensing electrode. The biasing voltage may be the ground potential.

10 Claims, 7 Drawing Sheets

U.S. PATENT DOCUMENTS

2008/0157802 A1  7/2008  Gardner et al.
2008/0315908 A1  12/2008  Gardner et al.

OTHER PUBLICATIONS

Office Action for Chinese Application No. 200680013627.4, dated Feb. 12, 2010, 14 pages.

U.S. Appl. No. 12/540,256, filed Aug. 12, 2009, Gardner et al.

International Search Report of the International Searching Authority for Application No. PCT/US2006/015056, Dated Sep. 25, 2007, 2 pages.

Written Opinion of the International Searching Authority for Application No. PCT/US2006/015056, Dated Sep. 25, 2007, 6 pages.

International Preliminary Report on Patentability for Application No. PCT/US2006/015056, Dated Oct. 23, 2007, 7 pages.

Non-Final Office Action for U.S. Appl. No. 11/379,413, mailed on Mar. 6, 2008, 9 pages.

Notice of Allowance for U.S. Appl. No. 11/379,413, mailed on Aug. 13, 2008, 5 pages.

Non-Final Office Action for U.S. Appl. No. 12/047,275, mailed on Aug. 27, 2008, 6 pages.

Non-Final Office Action for U.S. Appl. No. 12/047,275, mailed on Mar. 25, 2009, 7 pages.

Non-Final Office Action for U.S. Appl. No. 12/201,715, mailed on Mar. 12, 2009, 8 pages.

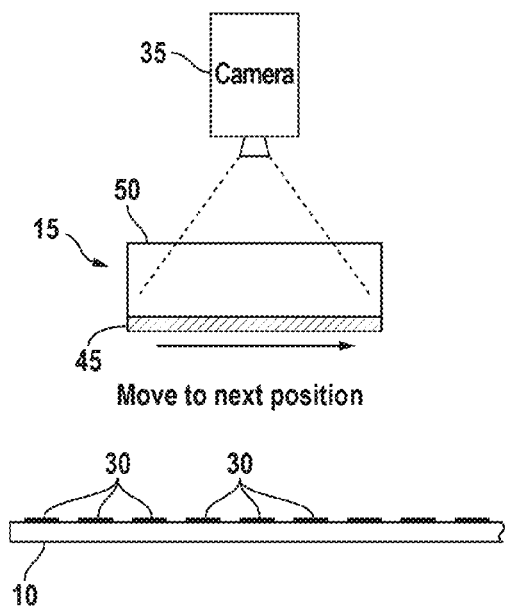
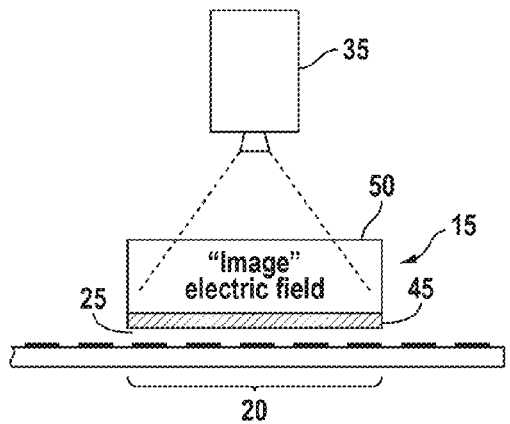
FIG. 1A
(PRIOR ART)
FIG. 1B
(PRIOR ART)
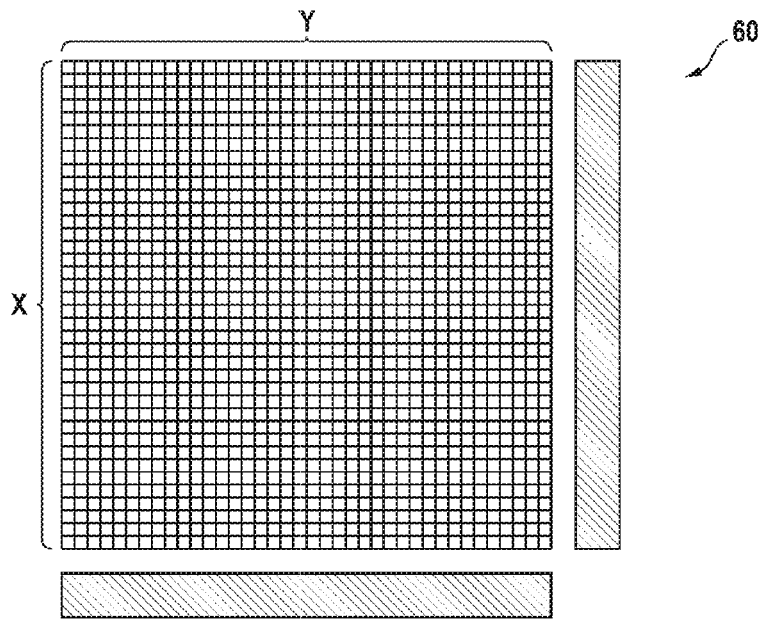
FIG. 2
(PRIOR ART)

METHOD FOR CAPACITIVE TESTING OF FLAT PANEL DISPLAYS

CROSS-REFERENCES TO RELATED APPLICATIONS

The present application is a continuation of U.S. application Ser. No. 12/047,275, filed Mar. 12, 2008, which is a division of U.S. application Ser. No. 11/379,413, filed Apr. 20, 2006 (U.S. Pat. No. 7,466,161), which claims benefit under 35 USC 119(e) of the following U.S. provisional applications: Application No. 60/673,967, filed Apr. 22, 2005, entitled "Detector For Measuring Functionality Of LCD Flat-Panel Pixels;" Application No. 60/687,621, filed Jun. 2, 2005, entitled "Testing Of LCD Electrode;" Application No. 60/689,601, filed Jun. 9, 2005, entitled "Testing Of LCD Electrode;" Application No. 60/697,844, filed Jul. 8, 2005, entitled "Direct Detect Sensor For OLED Display," the contents of all of which are incorporated herein by reference in their entirety.

BACKGROUND OF THE INVENTION

In a finished Liquid Crystal Flat Panel, a thin layer of liquid crystal (LC) material is disposed between two sheets of glass. On one sheet of glass, a two-dimensional array of electrodes has been patterned. Each electrode may be on the order of 100 microns in size and can have a unique voltage applied to it via multiplexing transistors positioned along the edge of the panel. In a finished product, the electric field created by each individual electrode couples into the LC material and modulates the amount of transmitted light in that pixelated region. This effect when taken in aggregate across the entire 2-D array results in a visible image on the flat-panel.

A significant part of the manufacturing cost associated with LCD panels occurs when the LC material is injected between the upper and lower glass plates. It is therefore important to identify and correct any image quality problems prior to this manufacturing step. The problem with inspecting LCD panels prior to deposition of the liquid crystal (LC) material is that without LC material, there is no visible image available to inspect. Prior to deposition of LC material, the only signal present at a given pixel is the electric field generated by the voltage on that pixel (assuming no physical contact is made with the pixels).

To overcome this limitation, Photon Dynamics developed a floating modulator which, in part, includes a relatively large piece of optically flat glass with a thin layer of LC material formed on its surface, as shown in FIG. 1A.

To inspect the patterned glass plate 10, modulator 15 is physically moved over a region 20 to be inspected and then lowered to within a few microns of the flat-panel's surface, as shown in FIG. 1B. The small air gap 25 between the flat-panel electrodes 30 and the LC modulator 15 allows the electric field from each pixel electrode 30 on the patterned glass plate 10 to couple to modulator 15 to create a temporary visible display of the panel. This visible display is subsequently captured by camera 35 for identification of defects. After inspecting region 20, modulator 15 is lifted and moved to another region on the panel and the process is repeated. Through this step-and-repeat process, the entire LC panel can be inspected for defects. As shown in FIGS. 1A and 1B, LC modulator 15 is shown as including, an LC material 45 and a flat glass 50.

There is a growing need to increase the inspection speed. Inspecting an LCD panel at high speeds using the modulator described above poses technical challenges. For example, the need to physically lift the modulator (which may weigh several pounds) from its present site, move it to the next site and then lower it in preparation for the next inspection operation affects the system throughput.

Moreover, with the modulator described above, the visible image created on the thin LCD layer is obtained by reflecting light from the surface of the LC material. The LC material acts a scattering medium in its off-state and a transmissive medium in the on-state. This typically results in the generation of a DC-component of light modulated with a relatively small mount of information. To camera 35, this means that the imager must be able to handle a relatively large signal (for the DC component) even though the signal containing the information is relatively weak. Furthermore, the relatively large DC-component of light component may carry a correspondingly large amount of shot noise which needs to be overcome to enable one to reproduce the flat-panel defect data. Furthermore, presently known modulators do not readily lend themselves directly to a continuous, linear scanning.

Non-contact capacitive coupling techniques have been developed to test LCD flat panel arrays. In accordance with one such known method, an electrically floating (open-circuited) conductive plate or a diffusion region is brought into close proximity of the LCD panel. This causes the voltage on the LCD pixel to capacitively couple to the floating plate, thereby causing its voltage to vary in proportion to the ratio of the air-gap capacitance to the parasitic capacitances (plate to substrate as well as plate to surrounding circuitry). This voltage change can then be buffered and supplied off-chip to be measured. FIG. 2 shows a two-dimensional array 60 of sensors that may be capacitively coupled to test an LCD panel. Such two-dimensional arrays 60 suffer from a number of disadvantages.

First, such two-dimensional arrays require step-and-repeat movements, thus lowering the testing throughput. Second, the parasitic capacitances of such arrays are relatively large which may result in poor sensitivity. Furthermore, since many of the parasitic capacitances are non-linear (especially when diffusions regions are used) the sensor itself behaves nonlinearly. Moreover, in such two-dimensional arrays, the read-out addressing lines which select which pixel values are sent off-chip, have relatively larger parasitic capacitances.

As is shown in FIG. 2, array 60 is adapted to include both horizontal address lines X and vertical address lines Y running through each pixel element. The distance between these addressing lines and the floating plate will typically be less than the distance from the detector chip to the LCD panel. Therefore, the amount of addressing crosstalk seen in the output data is often relatively large. Furthermore, when testing, e.g., a 40 microns×40 microns per pixel element using two-dimensional array 60, it is required that the sensing circuitry and the sensing electrode (floating plate) for each pixel fit within substantially the same, e.g., 40×40 microns$^2$ area. The area limitation imposed by the horizontal and vertical dimensions of any given pixel prevents the development and use of complex sensing circuitry on two-dimensional arrays. Accordingly, the two-dimensional arrays are forced to use simple sensing circuitry that may not be effective.

FIG. 3 shows a passive conductive plate 205 positioned in close proximity of an LCD pixel electrode 210 to sense the voltage on LCD pixel electrode 210, as known in the prior art. The LCD pixel electrode 210 and the opposing passive electrode 205 form a simple parallel plate capacitor having a capacitance defined by $\epsilon A/D$, where $\epsilon$ is the dielectric constant of the material between the plates, A is the plate area and D is the separation distance between the plates. The degree to which the LCD voltage is coupled to the opposing electrode is determined by the ratio of the parallel plate capacitance defined by plates 205, 210, to the other parasitic capacitances, such as C1 and C2, among others. The larger these parasitic capacitances, the smaller the size of the coupled voltage. Moreover, many of the parasitic capacitance are non-linear and result in a non-linear response in the coupling characteristic. With the exception of reset transistor 230 which periodically resets the passive electrode 205 to a known DC level Vreset, electrode 205 is floating or passive during the sensing process. As is shown, transistor 230 has a source terminal coupled to sensing electrode 205, a gate terminal receiving reset clock signal reset_clk, and a drain terminal coupled to the reset biasing voltage Vreset.

While simple to implement, there are numerous disadvantages to the prior art sensing technique shown in FIG. 3. First, since the passive electrode 205 is floating, its voltage changes as the LCD pixel voltage coupled thereto via plate 210 varies. Accordingly, the parasitic capacitance C1 and C2 directly impact the coupling sensitivity. Second, since the load resistor 220 is adapted to provide gain, the apparent capacitance seen at C1, which is the parasitic capacitance between the gate and drain of transistor 215, is multiplied by this gain, due to the well-known Miller gain effect. This will further reduce detection sensitivity. Third, any noise on the power supply Vdd will couple directly into the output signal Output. Fourth, any variations in the gain of transistor 215 due to aging, temperature or processing directly impacts the output signal quality. Fifth, the multiplication effect of the capacitance C1 reduces the bandwidth of the gain stage provided by transistor 215. Sixth, since the parasitic capacitances are predominantly junction capacitances, the voltage coupling is non-linear. Seventh, the circuit output is limited to a binary logic state, and detection depends on a time-varying change in voltage in the LCD pixel elements during the sensing process.

Active matrix organic light emitting diode (AMOLED) displays require backplanes made with either amorphous or polycrystalline-silicon thin film transistors (TFT). Polycrystalline silicon displays require fabrication using low temperature processes (LTPS) in order to avoid damage to glass and especially flexible (e.g. plastic) substrates. The fabrication of AMOLED backplanes using LTPS can be quite complex requiring as many as, for example, 10 mask steps with precision control requirements. This has been identified as a potential challenge for low cost, high yield manufacturing of large scale AMOLED displays. The fabrication of AMOLED displays using amorphous Si backplanes may require fewer mask steps, but is nearly as challenging. As AMOLED displays become larger, the need for inspection and yield management becomes more critical. Efforts are underway to improve these processes. However, there has been less focus on the development of AMOLED inspection tools, even though they offer the dual promise of more efficient convergence on process development as well as improved yield and lowered cost in AMOLED manufacturing—by capturing killer defects early in the fabrication cycle. As AMOLED displays grow in size and value for the monitor and TV markets, the need for inspections tools will become critical.

One conventional method of inspecting OLED display is to optically inspect the backplanes. FIG. 4 shows an x-y array 400 of pads adapted to receive OLEDs 402. Each OLED $402_{ij}$. pad is coupled via an associated transistor $420_{ij}$ to a data line and to a gate line, where index i refers to the row and index j refers to the column in which the OLED pad $402_{ij}$ is disposed. Three such data lines, 406, 408, and 410 are shown, and four such gate lines 412, 414, 416, and 418 are shown. For example, OLED pad $402_{11}$ is shown as being coupled to data line 406 and to gate line 416 via transistor $420_{11}$. Optical testing does not provide functional information on the pixels.

BRIEF SUMMARY OF THE INVENTION

In accordance with one embodiment of the present invention, each sensor of a linear array of sensors includes, in part, a sensing plate (electrode) and an associated feedback circuit. The sensing electrodes are adapted to be brought in proximity to a flat panel having formed thereon a multitude of pixel electrodes so as to measure the voltage of the pixel electrodes capacitively, i.e., in a non-contact manner. Each feedback circuit is adapted to actively drive its associated sensing electrode so as to maintain the voltage of its associated sensing electrode at a substantially fixed bias. The feedback circuits enable sensing of the pixel voltages without requiring temporal variations in the pixel voltages. The linear array of sensors is adapted to be scanned over the panel at a constant scanning rate. The flat panel may include LCD pixels, OLED pixels, or the like.

In one embodiment, each feedback circuit includes, in part, an amplification circuit having a first input terminal coupled to the sensing electrode and a second input terminal coupled to receive a biasing voltage. The output signal of the amplification circuit is used to generate the feedback signal that actively drives the sensing electrode. The feedback circuit and its associated sensing electrode may be formed on the same semiconductor substrate or on different semiconductor substrates.

In one embodiment, the biasing voltage supply is the ground potential, however, it is understood that any other DC biasing voltage may be used. In one embodiment the amplification circuit is an operational amplifier (op-amp), however, it is understood that any other amplification circuit, notwithstanding its complexity, which uses feedback to maintain a fixed voltage at the amplifier input may be used. In such embodiments, a capacitive elements may be coupled between the first input terminal and the output terminal of the amplifier. The output signal of the op-amp changes in linear proportion to the pixel electrode voltage. Since the op-amp actively drives its associated sensing electrode to a known DC potential, parasitic capacitances at the input terminal of op-amp have a relatively small effect on the detection sensitivity.

To perform the testing, a fixed pattern of DC voltages is applied to the pixels on the panel at the beginning of the scan. As the linear array is moved across the board and each new pixel is scanned, the feedback circuit associated with each sensing electrode receives the signal sensed thereby as a result of capacitive coupling. The amount of current required to maintain each sensing electrode at the substantially fixed biasing voltage is integrated on the feedback capacitor and provides a measure of the sensed electric field generated by the pixel electrode and capacitively coupled to that sensing electrode. The op-amp may be reset periodically to avoid drifts caused by leakage currents.

In one embodiment, the LCD panel is periodically refreshed to inhibit drooping of the pixel voltages. Because in the present invention, the linear scanning is continuous, during the refresh period some of the scanned pixel data may not be valid. To ensure that every row of pixels is scanned during a period when the LCD panel data is valid, a second linear array of sensors positioned at a known distance away from the first linear array of sensors is used. Thus the pixel rows that are scanned by the first linear array during the periods when data is invalid are scanned by the second linear array after the refresh is complete and the data is again valid.

Defects such as weak shorts or leaking transistors are detected by measuring the amount of the voltage droop on a pixel after the elapse of a known time period following a refresh cycle. To accomplish this, a third linear array of sensors spaced away from the first and second array of sensors is used. The voltage droops are measured by a pair of linear sensors at two different instances of time.

BRIEF DESCRIPTION OF THE DRAWINGS

FIG. 1A shows a floating modulator positioned above a patterned glass plate, as known in the prior art.

FIG. 1B shows the floating modulator of FIG. 1 positioned in proximity of the patterned glass plate to perform testing, as known in the prior art.

FIG. 2 shows a two-dimensional array of sensors, as known in the prior art.

DETAILED DESCRIPTION OF THE INVENTION

In accordance with one embodiment of the present invention, a linear array of sensors is brought in proximity (e.g., 10 microns to 100 microns) to a flat panel under test, and the electric field generated by the panel electrodes is capacitively measured. In one exemplary embodiment, the flat panel is an LCD panel and each sensor includes a sensing electrode and an amplifying circuit. A scanning rate of about 100 millimeters per second or about 100 microns per millisecond may be used. The following description is provided with reference to an LCD panel. It is understood, however, that the present invention is equally applicable to any other types of panels.

Figure 3:
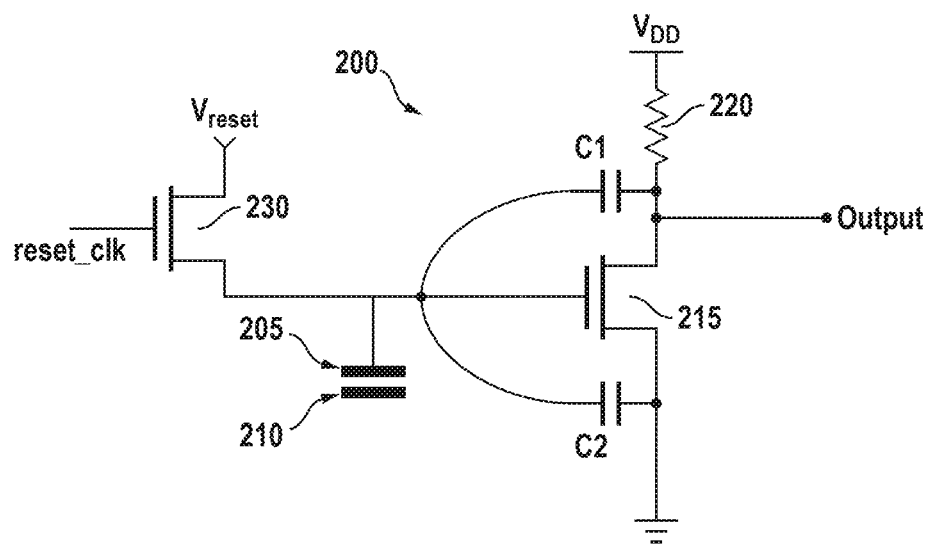
FIG. 3 shows a passive conductive plate positioned in close proximity to an LCD pixel electrode to sense the voltage thereon, as known in the prior art.
Figure 4:
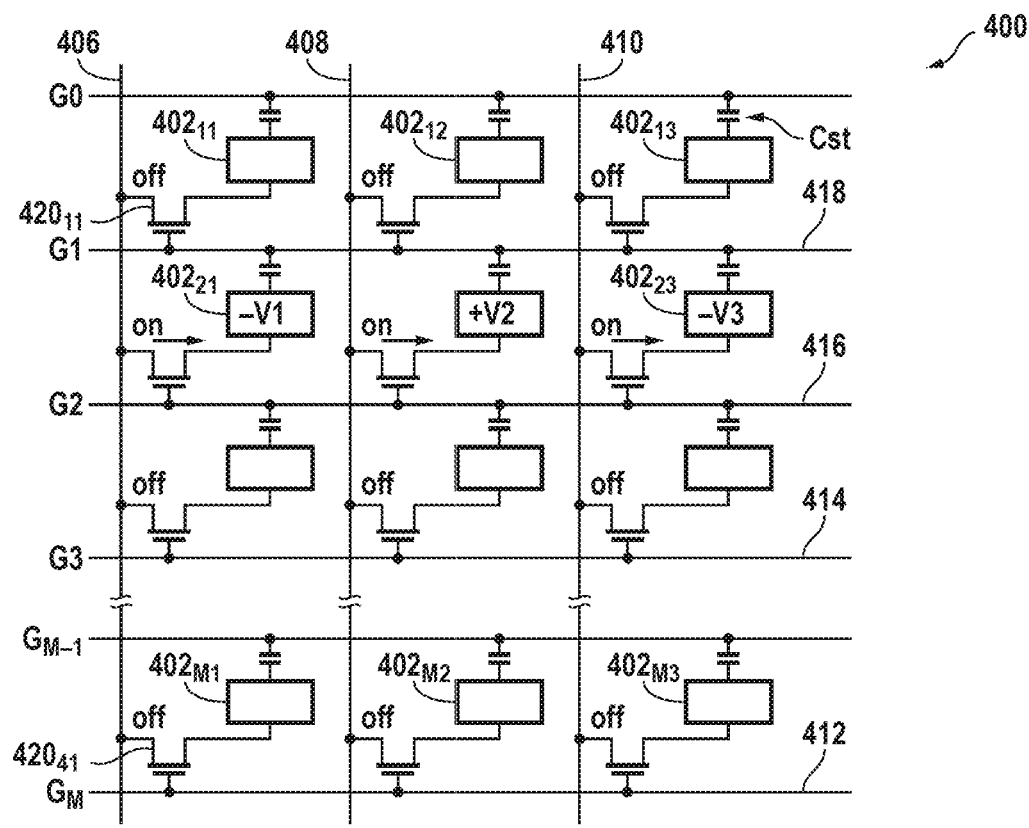
FIG. 4 shows a two-dimensional array of pads adapted to receive OLEDs, as known in the prior art.
Figure 5:
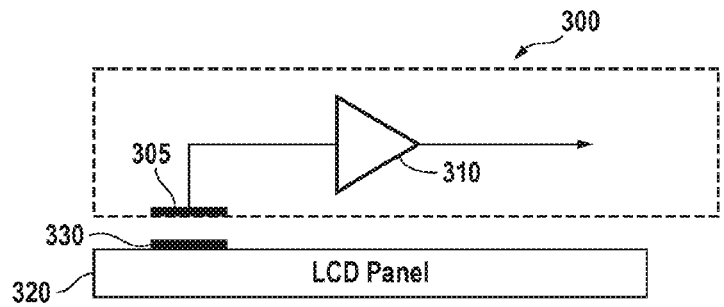
FIG. 5 shows a sensor positioned in proximity of a pixel electrode to test the voltage present thereon, in accordance with one embodiment of the present invention.
Figure 6A:
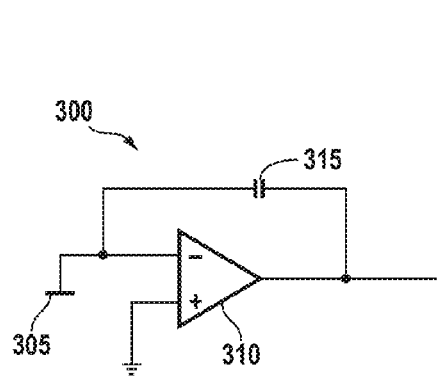
FIG. 6A shows an actively driven sensor, in accordance with one embodiment of the present invention.

FIG. 5 shows a sensor 300 positioned in proximity to panel 320 which includes a multitude of pixels 330, only one of which is shown. Sensor 300 is shown as including a sensing electrode (conductive plate) 305 as well as an amplification circuit 310, in accordance with one embodiment of the present invention. FIG. 6A shows sensor 300 in which amplification circuit 310 is an operational amplifier (op-amp) being used in a feed-back configuration. In the exemplary embodiment shown in FIG. 6A, the negative input terminal of op-amp 310 is connected to sensing electrode 305 and to the output terminal of the op-amp 310 via feedback capacitor 315. The positive input terminal of op-amp 310 is shown as connected to the ground terminal. Sensing electrode 305 is actively driven to maintain its voltage at the known voltage of the ground potential. Consequently, because the positive input terminal of op-amp 310 receives the ground potential, as the sensor 300 is brought into proximity of an LCD pixel, sensing electrode 305 is maintained at the virtual ground potential, notwithstanding the voltage of the pixel being sensed. In other words, sensing electrode 305 is maintained at the virtual ground potential regardless of the opposing pixel voltage being sensed.

Figure 6B:
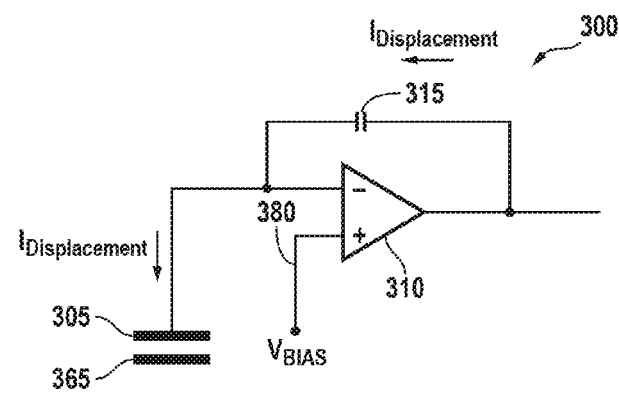
FIG. 6B shows an actively driven sensor, in accordance with another embodiment of the present invention.

FIG. 6B is a schematic diagram of a sensor 300, in accordance with another embodiment of the present invention. Sensing electrode 305 is actively driven to a fixed DC level through the use of the high-gain feedback network. The displacement charge necessary to maintain this voltage is sensed as the LCD pixel 365 is brought into close proximity of sensing electrode 305. The exemplary feedback network is shown as including an op-amp 310, and a capacitor 315. Op-amp 310 is adapted to maintain the voltage on sensing electrode 305 to the bias voltage VBias applied to the non-inverting input terminal 380 of op-amp 310. It is understood that the present invention is applicable to any other feedback circuitry configured to sense and actively drive sensor electrode 305 to maintain its voltage at a substantially constant value. For example, in one embodiment, sensor 300 has an open loop gain of nearly 1000. As a consequence, in such embodiments, the voltage changes at sensing electrode 305 are kept to $1/1000^{th}$ of the voltage changes seen at the output of the amplifier 310. Accordingly, if for example, the maximum voltage swing at the amplifier output is about 2 volts, the voltage at sensing electrode 305 changes by a maximum of 2 mV.

In the exemplary embodiment shown in FIGS. 6A and 6B, because of the feedback, the current flows from the inverting side of the op-amp to insure that the voltage on the electrode 305 does not vary as the LCD pixel electrode is brought into its close proximity. The high-impedance of the op-amp input terminals requires that substantially most of the current which flows to the sensing electrode 305 come from the feedback capacitor 315. The resulting change in voltage across the feedback capacitor 315 is defined by Q/C, where Q is the total charge needed to maintain the sense electrode 305 at the fixed potential and C is the capacitance of capacitor 315.

The output signal of op-amp 310 changes in linear proportion to the LCD pixel electrode voltage, where the constant of proportionality is C. Consequently, the sensor array can distinguish pixel outputs of varying gray scale values with fixed DC level voltage applied to the pixels. Since op-amp 310 actively drives sensing electrode 305 to a known DC potential, parasitic capacitances at the input terminals of op-amp 310 have a relatively small effect on the detection sensitivity. Other advantages of the feedback configuration, in accordance with the present invention, include, among other things, (i) power supply noise rejection, (ii) linearity since the gain mechanism is controlled by the linear feedback capacitor rather than a non-linear open-loop transistor characteristic, (iii) immunity to gain, processing differences and aging variation due to the feedback approach, and (iv) wide bandwidth due to the fact that the Miller gain multiplier is substantially eliminated.

It is understood that the sensing circuit, which in the exemplary embodiments of FIGS. 6A and 6B is shown as including an op-amp 310 and a capacitor 315, defining a feed-back network, and sensing electrode 305 may be formed on the same semiconductor substrate. Alternatively the op-amp 310 and capacitor 305 may be formed on a semiconductor substrate different from the one on which sensing electrode 305 is formed.

To perform the testing, a fixed pattern of DC voltages is applied to the pixels on the panel (board) at the beginning of the scan. The current required by op-amp 310 to keep sensing electrode 305 at the constant potential provides a measure of the pixel voltage. As the linear array is moved across the board and each new pixel is scanned, op-amp 310 senses the resultant electric field of the static pattern. The op-amp may be reset periodically, e.g. at 30 Hz or less, to avoid drifts caused by any leakage current.

Figure 7A:
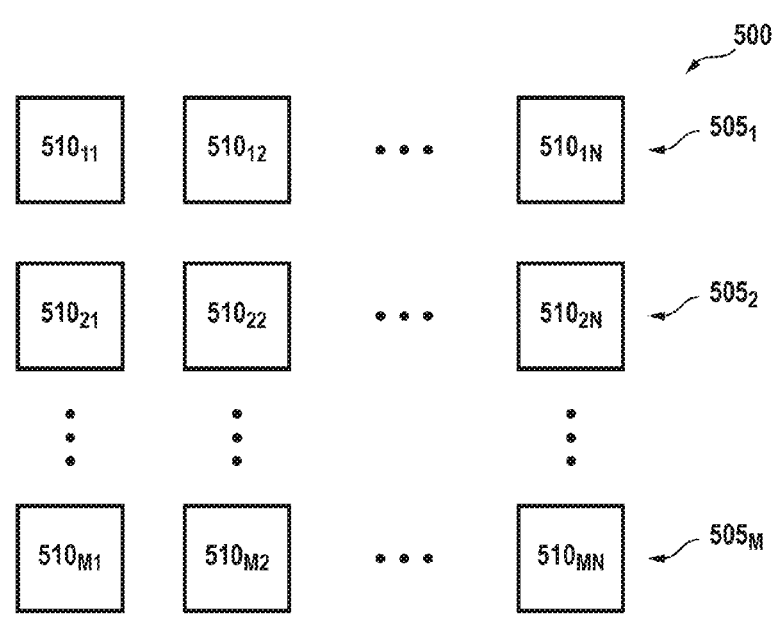
FIG. 7A shows a linear array of actively driven sensors, in accordance with one embodiment of the present invention.
Figure 7B:
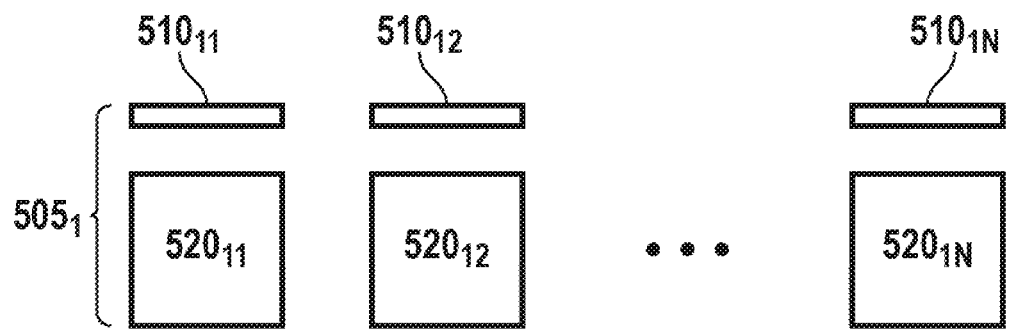
FIG. 7B shows a simplified cross-sectional view of the linear array of the sensors shown in FIG. 7A.

FIG. 7A is a top view 500 of M linear arrays (rows) $505_1$, $505_2 \ldots 505_M$ of sensing electrodes, in accordance with one embodiment of the present invention. Because the sensor arrays of the present invention are linear, only row decoding is required to access any of the sensing electrodes—no column decoding is required. In other words, to access any of the sensors disposed in any of the rows $505_1, 505_2 \ldots 505_M$ only row address decoding is performed. Top view 500 of the linear sensor elements is shown as having N sensing electrodes $510_{ij}$ in each of the M rows, where index i refers to the row and index j refers to the column in which the sensing electrode is disposed. For example, row $505_1$ is shown as including sensing electrodes $510_{11}, 510_{12} \ldots 510_{1N}$, and row $505_M$ is shown as including sensing electrodes $510_{M1}, 510_{M2} \ldots 510_{MN}$. Formed below each of the sensing electrodes $510_{ij}$ is the sensing circuitry associated with that sensing electrode. FIG. 7B shows a simplified cross-sectional view of linear array $505_1$. As is seen from FIG. 7B, each sensing circuitry $520_{1j}$ is positioned below its associated sensing electrode $510_{1j}$ to which it is coupled.

Figure 7C:
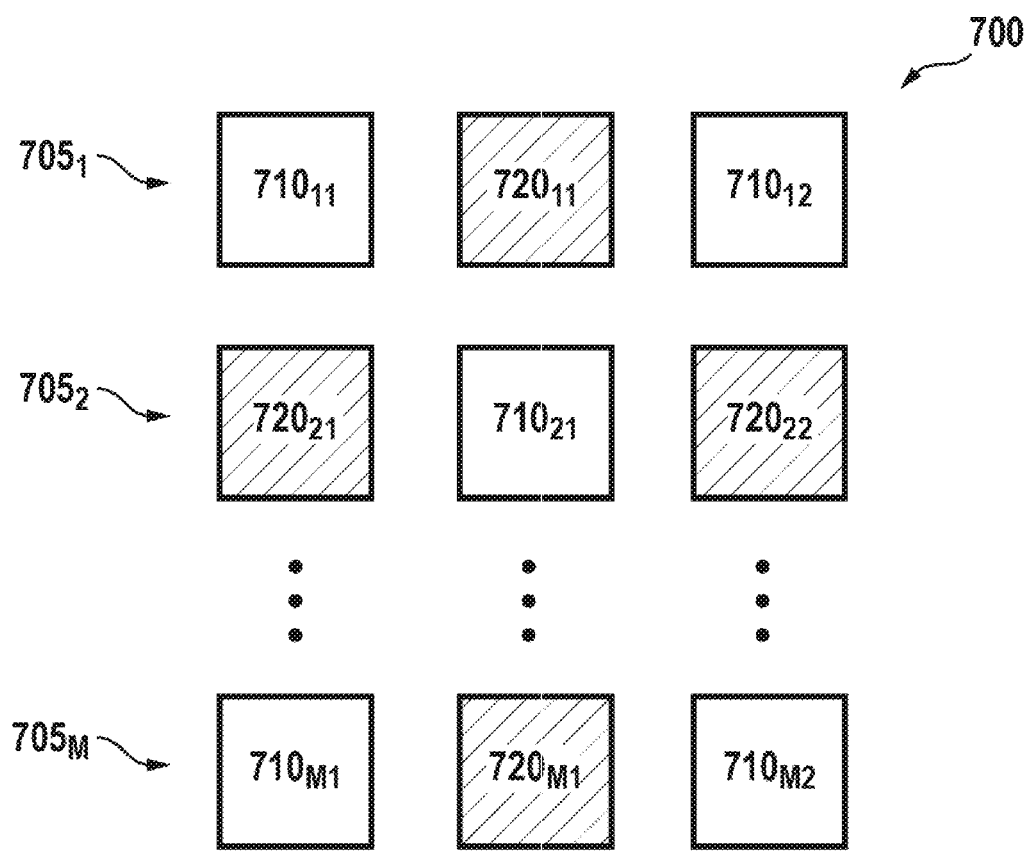
FIG. 7C shows a linear array of actively driven sensors, in accordance with another embodiment of the present invention.

FIG. 7C is a top view 700 of M linear arrays (rows) $705_1$, $705_2 \ldots 705_M$ of sensing electrodes, in accordance with one embodiment of the present invention. In accordance with embodiment 700, sensing circuits $720_{ij}$ are disposed between sensing electrodes $710_{ij}$ in a checker board format. In FIG. 7C, sensing circuits $720_{ij}$ are shown within shaded regions to indicate that they are formed within the silicon substrate and adjacent the sensing electrodes.

Because the sensors of the present invention are arranged linearly, a number of advantages, such as advantages in physical placement of the sensors as well as the detection circuitry, are achieved over the prior art two dimensional arrays are. For example, if each sensor has an x dimension of 40 microns, and a y dimension of 40 microns, each sensing electrode 305 is formed to be of the same size, e.g., 40 microns×40 microns thus enabling the associated electronic circuitry, e.g., amplifier, capacitor, and the like, to be formed adjacent the sensing electrode. The additional silicon real-estate available below each sensing electrode enables the formation of more complex circuitry, such as op-amps 310 which use feedback to hold the pixel plate to a known value, as described above, and shown in FIGS. 6A and 6B.

The use of feedback, as shown in FIGS. 6A and 6B, enables amplifier 310 to have a highly linear response and to collect repeatable data that is less dependent on fabrication processes. The feedback arrangement via capacitor 315 also minimizes temperature variations and aging effects during operation. This feedback maintains the voltage on sensing electrode 305 to a known value regardless of the LCD pixel value undergoing sensing and measurement. Thus, instead of sensing the LCD voltage change directly, each sensor of the present invention measures the amount of current required by the op-amp 310 to maintain sensing electrode 305 at a constant potential for differing LCD pixel voltages. Since the voltage on sensing electrode 305 does not change, sensitivity is not degraded by parasitic capacitance. Moreover, since there is only need for addressing in one dimension, addressing lines may be run outside of the area of the active sensing electrode, thus eliminating noise generated by addressing feed-through.

When using a shorting bar prober, the limited bandwidth of an LCD panel allows for changing a given LCD pixel voltage about 60 times per second. It is therefore crucial that the sensor be adapted so as not to require a temporal change in the LCD pixel voltage in order to sense each new pixel value. Conventional prior art sensing techniques require a temporal change in the LCD pixel voltage of at least 2 KHz in order to enable the sensing be performed, this is a difficult rate to achieve. A sensor, in accordance with the present invention, senses the LCD pixel voltage without requiring temporal variations in the LCD pixel voltages. To achieve this, at the beginning of a scan, a fixed pattern of voltages is applied across the array of the LCD panel. As the linear array of sensors is moved across the array and each new LCD pixel is scanned, op-amp 310 senses the resultant electric field of the static pattern. In some embodiments, op-amp 310 may need to be reset periodically, e.g. 30 Hz, to avoid drift from leakage currents.

In one embodiment, the LCD panel is refreshed once every, e.g., 30-50 ms, to inhibit the voltages applied to the pixels from drooping over time. This refreshing process may require, e.g., about 4-7 ms to complete. Because in the present invention the linear scanning is continuous, during the refresh period some of the scanned LCD panel data may not be valid. To overcome this, in some embodiments, in part, at least two linear sensors separated by a known physical distance are disposed on the same chip. The use of a pair of sensors ensures that the data missed by the leading sensor array during the LCD panel refresh interval is picked up by the second sensor which follows the first sensor during the scan process. In other words, to ensure that every row of pixels is scanned during a period when the LCD panel data is valid, a second array is spaced from the first so that the second array passes over a given row of pixels about, e.g., 7-10 ms (somewhat more than the time of invalid data) after the first array. Thus those rows that are scanned by the first array during the periods when data is invalid are scanned by the second array after the refresh is complete and the data is again valid.

Figure 8:
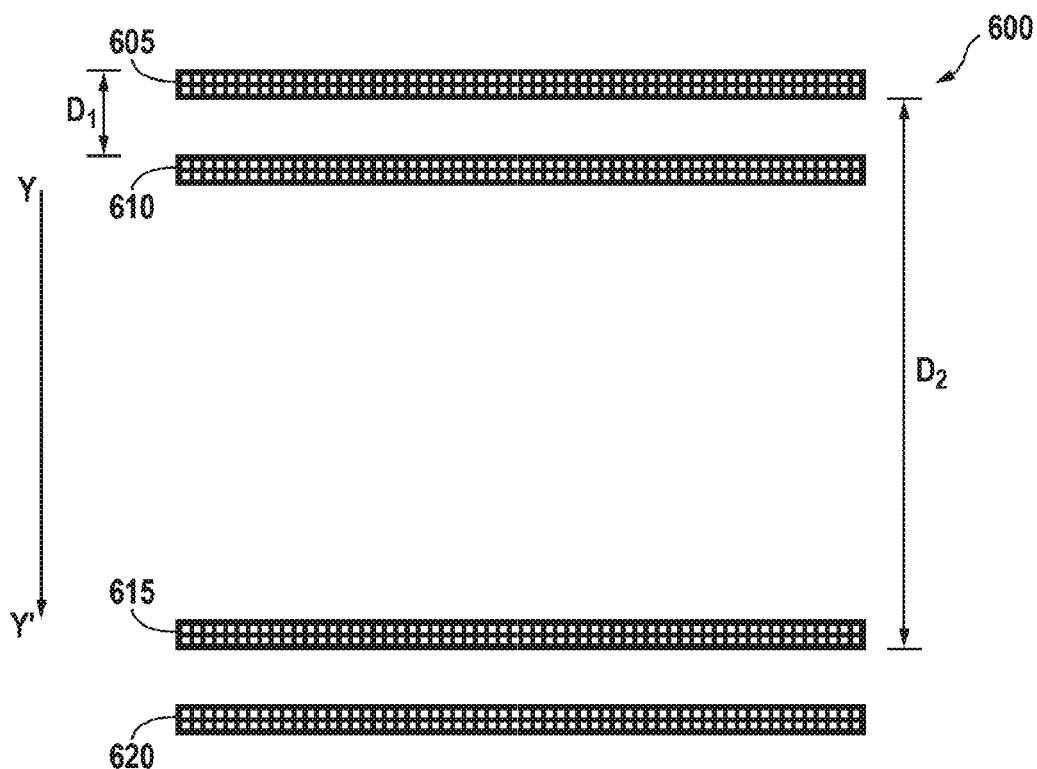
FIG. 8 shows a multitude of linear array sensors, in accordance with one embodiment of the present invention.

FIG. 8 shows a multitude of linear array sensors 600, in accordance with one embodiment of the present invention. Only four of the linear arrays, namely arrays 605, 610, 615, and 620 are shown. During testing, sensor array 600 is caused to travel along the YY' direction. The distance between arrays 605 and 615 is D2 microns, and similarly the distance between arrays 610 and 620 is D2 microns. At a scan rate of 100 microns per ms, D2=700–1000 microns. Although not shown, it is understood that many more linear array sensors with similar characteristics and having corresponding physical relationships may be used.

Assume that linear array sensors 600 are traveling along YY' direction. The linear arrays are so disposed such that pixels with invalid data sensed by the leading sensors in array 620 during a refresh cycle of a linear scan are sensed and their voltages captured by sensor 610 after elapse of a known time period. Similarly, pixels with invalid data sensed by the sensors in leading array 615 during such a refresh cycle of the linear scan, are sensed and their voltages captured by sensor 605 during that scan.

The present invention is also adapted to detect the presence of such defects, as weak shorts or leaking transistors. These types of defects are measured by observing the voltage on a pixel some known time after the refresh cycle to see how much droop has occurred in the voltage level. To accomplish this, associated with each array is a second array spaced D1 microns from that array. Referring to FIG. 8, arrays 605 and 610 are spaced D1 microns apart, e.g., about 1 to 5 ms delayed during the scan. At a scan rate of 100 microns per ms, D1=100 to 500 microns. Similarly, arrays 615 and 620 are also D1 microns apart. The voltage droops are measured in sensor 600 by the corresponding array pairs that are spaced D1 microns apart. For example, linear arrays 605 and 610 are used collectively to detect the amount of voltage droop experienced by the pixels being tested.

Figure 9:
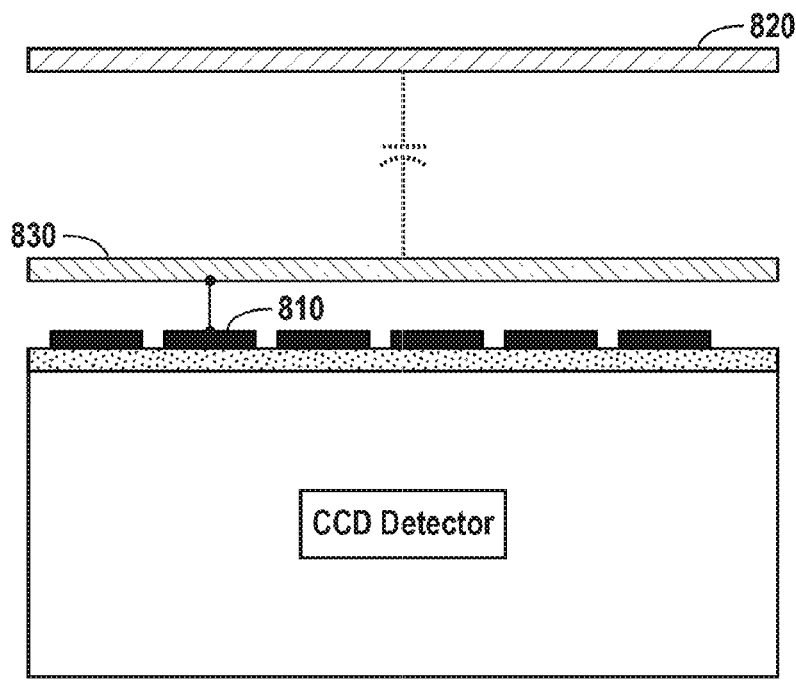
FIG. 9 shows a CCD sensor adapted to be used in the linear sensor array of the present invention, in accordance with one embodiment of the present invention.

In some embodiment, the linear array sensor uses a CCD architecture in the form of fill-and-spill samplers coupled to the floating gates, as shown in FIG. 9. Each CCD control gate 810 in the array of sensor elements is in electrical communication with an associated metal plate 830 which, in some embodiments, is roughly ½ the narrow dimension of the LCD pixel undergoing measurement. In other words, in such embodiments, if the LCD pixel is 100 microns wide and 300 microns tall, the CCD's metal plate (sensing electrode) may be 50 microns wide and 50 microns tall. To sense the e-field on the LCD panel, the array of metal plates 830 (only one of which is shown) is be brought in close proximity (10 to 100 microns) of the LCD panel electrodes 820 SO as to enable the electric field on the LCD pixels to capacitively couple to metal plates 830. Coupling of the electric field to the CCD metal plates induces a voltage in the CCD fill-and-spill sampler which is converted into a charge packet representation. Once in this form, the signal can be read out in a manner similar to a normal CCD imager.

Figure 10:
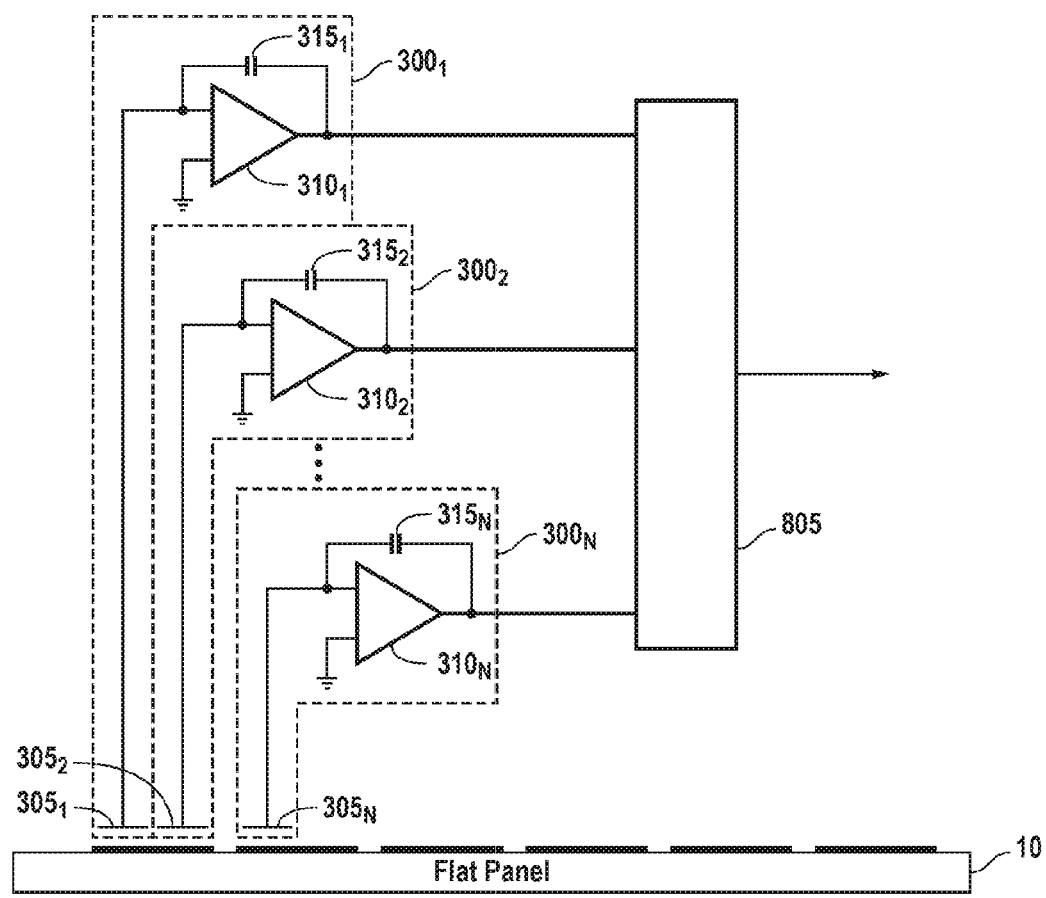
FIG. 10 shows a multitude of actively driven sensors disposed in a linear sensor array, in accordance with one embodiment of the present invention.

Some embodiments of the present invention include N linear sensor arrays configured to concurrently measure the voltages on different LCD pixels. To accommodate transfer of the data retrieved from any one of the arrays at any given time, one or more multiplexers are used. FIG. 10 shows an LCD panel 10 positioned in proximity to N linear array of sensors $300_1, 300_2 \ldots 300_N$. The signals sensed by the sensors are received by multiplexer 805 which selectively supplies one of the received signals at its output. The voltages supplied by each of the op-amps 310 is equal to the voltage of the pixel sensed by that op-amp 310 multiplied by the ratio $C_1/C_2$, where $C_1$ is the capacitance of any one of capacitors 315, and $C_2$ is the capacitance defined by any one of the sensing electrodes 305 and the opposing pixel electrode.

Figure 11:
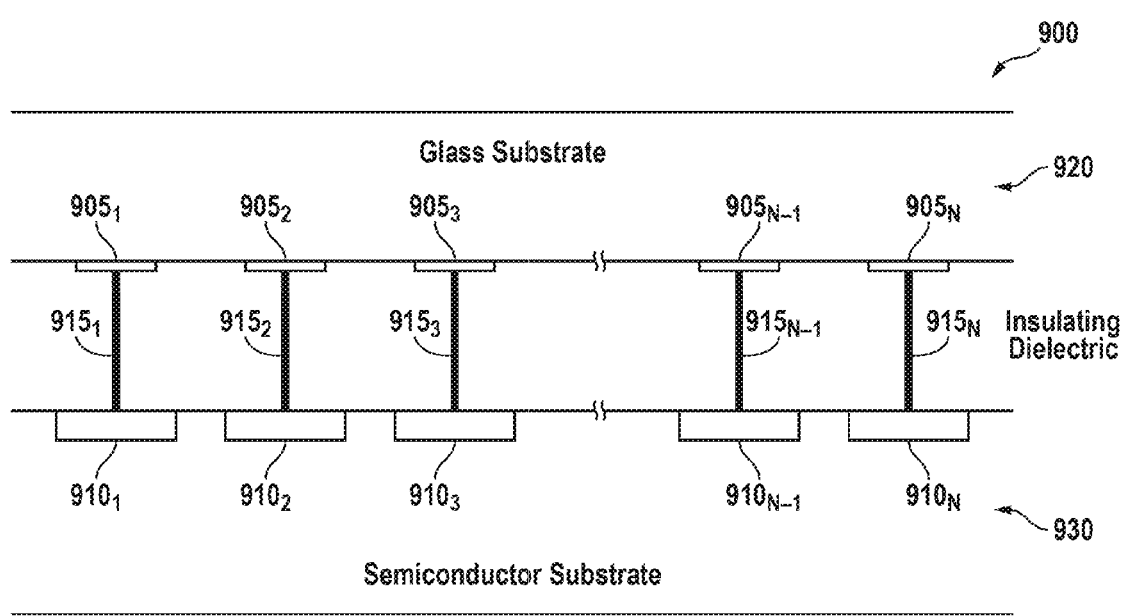
FIG. 11 shows a cross-sectional view of a linear array of sensors, in accordance with one embodiment of the present invention.

FIG. 11 shows a linear array 900 of sensors, in accordance with one embodiment of the present invention. In embodiment 900, capacitor sensing electrodes 905 are formed on glass substrate 920, and the active sensing circuitry, including the sense amps, etc., are formed on a semiconductor substrate 930. The array includes N capacitor plates $905_1, 905_2 \ldots 905_N$, formed on glass substrate 920, and N active sensing circuits $910_1, 910_2 \ldots 910_N$, formed on semiconductor substrate 920. Semiconductor substrate 930 and glass substrate 920 are insulated from one another via an insulating dielectric, such as silicon dioxide or silicon nitride. It is understood that the capacitor plates and active sensing circuits identified with the same index, are associated with and coupled to one another. For example, capacitor plate $905_1$ is coupled to and is associated with active sensing circuit $910_1$ via metal $915_1$. In some embodiments, spin-on glass may be used to form both the glass substrate, on which capacitor plates 905 are formed, as well as the insulating dielectric. In such embodiments, the glass substrate layer and the insulating dielectric layer are parts of the same layer that is formed using the spin-on glass.

Figure 12:
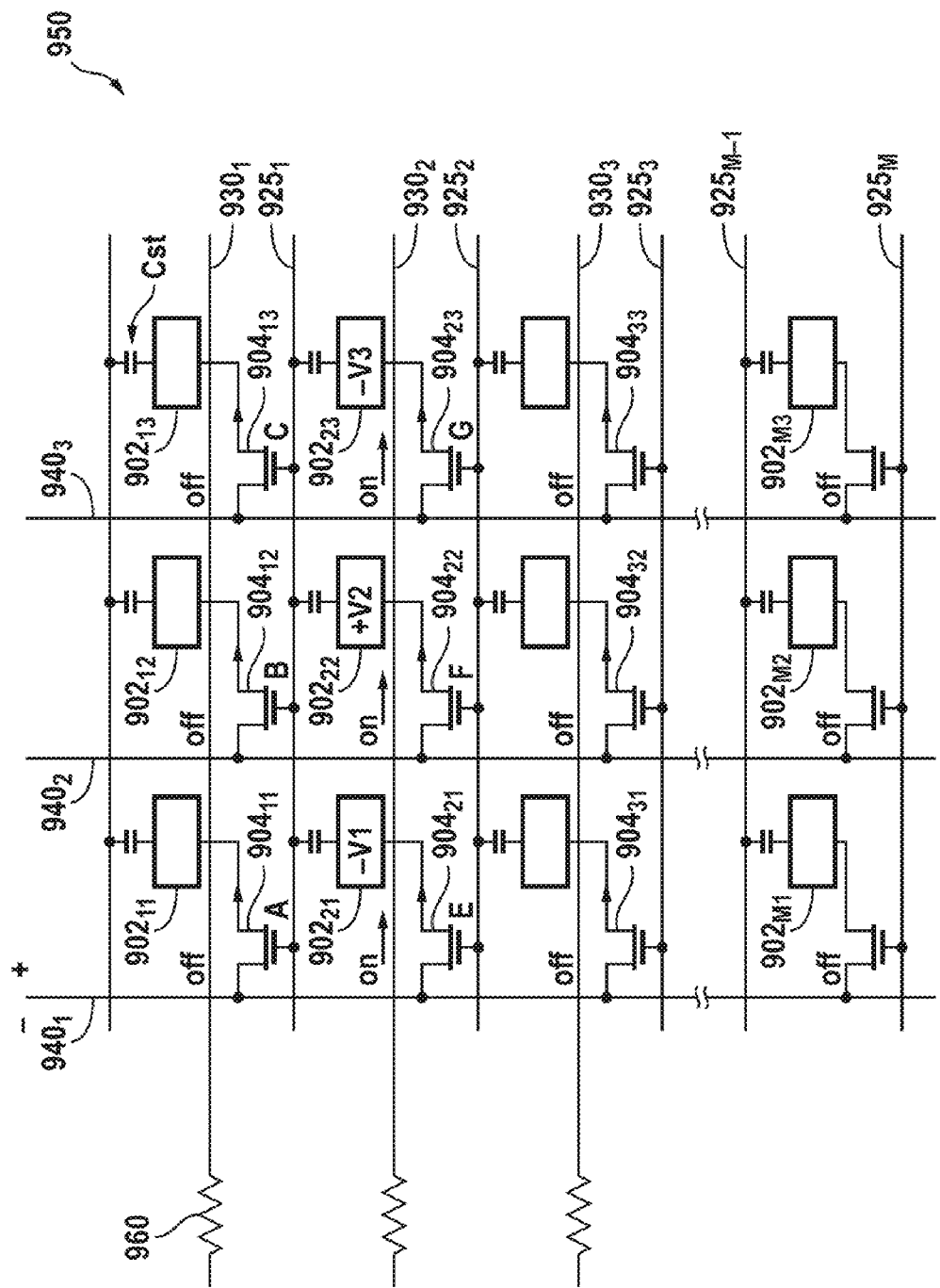
FIG. 12 shows an array of OLEDs adapted to be test using an array of linear sensors, in accordance with one embodiment of the present invention.

A linear array sensor, in accordance with some embodiment of the present invention, is operative to test OLED panels. To achieve this, a test line is disposed in each row of OLED pads to enable the transistors disposed in such rows to be tested using the direct detect sensing described above. FIG. 12 shows an x-y array 950 of pads adapted to receive OLEDs 902. Each OLED $902_{ij}$ pad is coupled via an associated transistor $904_{ij}$ to a data line and to a gate line, where index i refers to the row and index j refers to the column in which the OLED pad is disposed. Three such data lines, $940_1, 940_2, 940_3$, and four such gate lines $925_1, 925_2, 925_3$, and $925_M$ are shown. For example, OLED pad $902_{11}$ is shown as being coupled to data line $940_1$ and gate line $925_1$ via transistor $904_{11}$. It is understood that array 950 typically has more data and gate lines than that shown in FIG. 12.

Also disposed in each row is a test line positioned in parallel to the gate line. For example test line $930_1$ is disposed in parallel to and adjacent gate line $925_1$; test line $930_2$ is disposed in parallel to and adjacent gate line $925_2$, etc. In some embodiments, each test line is formed by a metal layer coupled to either the source or the drain terminal of the transistors disposed in that row. For example, test line $930_1$ is coupled to either the source or the drain terminals A, B and C of transistors $904_{11}, 904_{12}$ and $904_{13}$. The other drain/source terminals of these transistors is coupled to data lines $940_1$, $940_2$ and $940_3$. In the embodiment shown in FIG. 12, each test line is shown as being coupled to a resistor. For example, test line $930_1$ is coupled to one of the terminals of resistor 960.

When a voltage is applied to any of the gate lines, all the transistors coupled to that row are turned on. For example, when gate line $925_2$ receives a high voltage, transistors $904_{21}$, $904_{22}$ and $904_{23}$ are turned on. This causes a current to flow from the source (drain) terminals to the drain (source) terminals when a voltage potential is caused to appear across these terminals. The current flow causes a potential to develop at nodes E, F and G, respectively, of pads $902_{21}, 902_{22}$ and $902_{23}$. The voltages developed at the pads $902_{ij}$ may be subsequently measured in accordance with the direct detect sensing technique of the present invention to identify defects. Therefore, by allowing current to flow, the current carrying capacity of the pixel transistors could be characterized using the direct detect sensing (DDS) or other voltage sensing technology.

The direct detect sensing of the present invention identifies defects and provides process control data during the fabrication of OLED backplanes when the backplane is modified. The DDS together with a pixel load transistor enables current characterization on OLED backplane. Furthermore, combination of DDS with differential measurement of adjacent OLED pixels with (or without) pixel load transistor enables detection of small pixel current (or voltage) defects. Therefore, in accordance with the present invention, defects are detected and process control in OLED roll-to-roll fabrication is achieved.

In some embodiments of the present invention, instead of a test line connecting the output of the pixel transistor to a remote load resistor, the backplane could be modified to include a test transistor that would route a test current directly to ground when active. In yet other embodiments, the DDS is adapted to detect only the differentials between adjacent test pixels. This may be implemented either as a software program or in hardware by sampling the data stream at two points separated in time or space by an amount that corresponds to the separation between OLED pixels. The resulting signals would then be subtracted and defect detection algorithms would then be applied to this differential signal. This differential system may be vulnerable to voltage noise but the high SNR values of the DDS system is well suited for such applications.

Testing of the OLEDs, in accordance with present invention provides a number of advantages. Among such advantages are as follows. The testing in accordance with the present invention is faster and has a greater S/N than e-beam inspection tools; TACTs consistent with in-line operation (i.e., ~60 seconds/plate). The invention may be operated in any environment (from vacuum to atmospheric pressures with any degree of humidity control). The invention has spatial resolution on the scale of 10's of µm. The invention is scalable to large formats. The invention is adaptable to flexible substrate. The invention may also be used to measure current.

The above embodiments of the present invention are illustrative and not limiting. Various alternatives and equivalents are possible. The invention is not limited by the type of amplifier or amplification circuitry, feedback circuitry, biasing voltage, etc., used in the sensing circuits. The invention is not limited by the number of linear arrays nor is it limited by the number of sensors disposed in each liner array. The invention is not limited by the scanning rate. The invention is not limited by the type of integrated circuit in which the present disclosure may be disposed. Nor is the disclosure limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A method of testing a panel having formed thereon a plurality of pixels, the method comprising:
   scanning a first linear array of sensors over the panel;
   capacitively coupling a sensing electrode disposed in the first linear array of sensors to a pixel electrode of the panel at time T1 to sense the pixel electrode voltage;
   maintaining said sensing electrode pixel at a substantially constant voltage via a feedback signal generated in accordance with the sensed pixel electrode voltage to generate a first sensed data; and
   using the first sensed data to detect a defect in the pixel electrode.

2. The method of claim 1 further comprising:
   supplying the sensed pixel electrode voltage to a first input terminal of an amplifying circuit; and
   generating the feedback signal from an output voltage generated by the amplifying circuit.

3. The method of claim 2 wherein said amplifying circuit comprises an operational amplifier.

4. The method of claim 2 further comprising:
   supplying a biasing voltage to a second input terminal of the amplifying circuit.

5. The method of claim 4 wherein said biasing voltage is the ground potential.

6. The method of claim 4 further comprising:
   capacitively coupling the output terminal of the amplifying circuit to the first input terminal of the amplifying circuit.

7. The method of claim 2 further comprising:
   scanning a second linear array of sensors over the panel, said second linear array of sensors positioned at a first predetermined distance away from the first linear array of sensors and parallel to the scan direction;
   capacitively coupling a second sensing electrode disposed in the second linear array of sensors to the pixel electrode at time T2 to sense the pixel electrode voltage; wherein T2 and T1 are spaced in time by a first predefined value;
   maintaining said second sensing electrode pixel at a substantially constant voltage via a feedback signal generated in accordance with the pixel electrode voltage sensed by the second sensed electrode to generate a second sensed data; and
   using the second sensed data to detect a defect in the pixel electrode if the first sensed data is determined to be invalid.

8. The method of claim 7 further comprising:
   scanning a third linear array of sensors over the panel, said third linear array of sensors positioned at a second predetermined distance away from the first linear array of sensors and parallel to the scan direction;
   capacitively coupling a third sensing electrode disposed in the third linear array of sensors to the pixel electrode at time T3 to sense the pixel electrode voltage; wherein T3 and T1 are spaced in time by a second predefined value;
   maintaining said third sensing electrode pixel at a substantially constant voltage via a feedback signal generated in accordance with the pixel electrode voltage sensed by the third sensed electrode to generate a third sensed data, wherein a difference between the third sensed data and the first sensed data represents a voltage droop of the pixel electrode; and
   using the voltage droop represented by the third sensed data to detect a defect in the pixel electrode.

9. The method of claim 8 wherein each of the second and third sensors further comprises:
   a sensing electrode adapted to be capacitively coupled to the pixel electrode disposed on the panel; and
   an associated feedback network configured to maintain the voltage of the sensing electrode associated therewith at a substantially constant voltage when positioned in proximity of the pixel electrode to be capacitively coupled thereto.

10. The method of claim 1 wherein said pixel electrode receives a DC voltage before being capacitively coupled to the sensing electrode.

* * * * *